United States Patent [19]

Patrick et al.

[11] Patent Number: 4,752,738
[45] Date of Patent: Jun. 21, 1988

[54] THREE DIMENSIONAL LOCALIZED COIL FOR MAGNETIC RESONANCE IMAGING

[75] Inventors: John L. Patrick, Solon; Mehrdad Mehdizadeh, Euclid; Gregory C. Hurst, Shaker Hts., all of Ohio

[73] Assignee: Picker International, Inc., Highland Hts., Ohio

[21] Appl. No.: 931,726

[22] Filed: Nov. 17, 1986

Related U.S. Application Data

[63] Continuation-in-part of Ser. No. 765,708, Aug. 14, 1985.

[51] Int. Cl.4 ............................................. G01R 33/20
[52] U.S. Cl. .................................... 324/318; 324/309; 128/653
[58] Field of Search ............... 324/300, 309, 318, 322, 324/307, 241, 339; 128/1.4, 1.5, 653

[56] References Cited

U.S. PATENT DOCUMENTS

| | | | |
|---|---|---|---|
| 2,220,070 | 11/1940 | Aiken | 324/439 |
| 2,856,579 | 10/1958 | Packard | 324/318 |
| 2,999,977 | 9/1961 | Brown | 324/322 |
| 2,999,978 | 9/1961 | Pinkley | 324/322 |
| 4,095,168 | 6/1978 | Hlavka | 324/322 |
| 4,292,589 | 9/1981 | Bonner | 324/241 |
| 4,468,622 | 8/1984 | Frese et al. | 324/318 |
| 4,477,777 | 10/1984 | Gordon | 324/307 |
| 4,592,363 | 6/1986 | Krause | 128/653 |
| 4,621,237 | 11/1986 | Timms | 324/318 |
| 4,636,730 | 1/1987 | Bottomley | 324/318 |

OTHER PUBLICATIONS

"Noise Performance of Surface Coils for Magnetic Resonance Imaging at 1.5 T" by Cecil E. Hayes and Leon Axel, Medical Physics, vol. 12, No. 5, Sep./Oct. 1985.

"High Resolution Methods Using Local Coils" by James S. Hyde, Ph.D. and J. Bruce Kneeland, MD., Biomedical Magnetic Resonance Imaging, VCH Publishers, Inc., 1985.

Primary Examiner—Stewart J. Levy
Assistant Examiner—Kevin D. O'Shea
Attorney, Agent, or Firm—Fay, Sharpe, Beall, Fagan, Minnich & McKee

[57] ABSTRACT

The magnetic resonance signals in a magnetic resonance imaging apparatus are detected by a surface or localized coil assembly (D). To improve the field homogeneity and increase the signal-to-noise ratio when examining a region of interest deep within a subject, the surface coil assembly is configured with a first coil portion (22) and a second coil portion (24). The first coil portion is disposed along an exterior surface of the subject. The second coil portion is disposed parallel to the first coil portion and displaced outward a distance (44) from the first coil portion and the subject exterior surface. The first and second coil portions are electrically interconnected with an opposite current phase in a dipole pair such that the second current portion reduces the sensitivity of the first coil portion to magnetic resonance signals originating close to the surface of the subject.

22 Claims, 5 Drawing Sheets

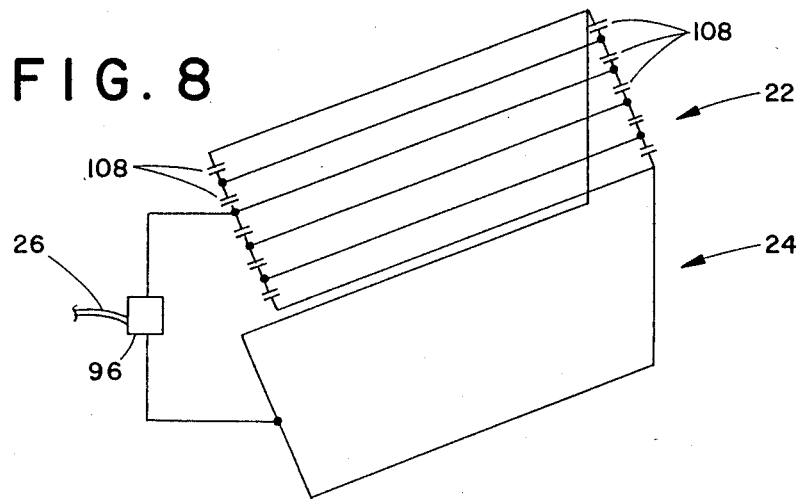
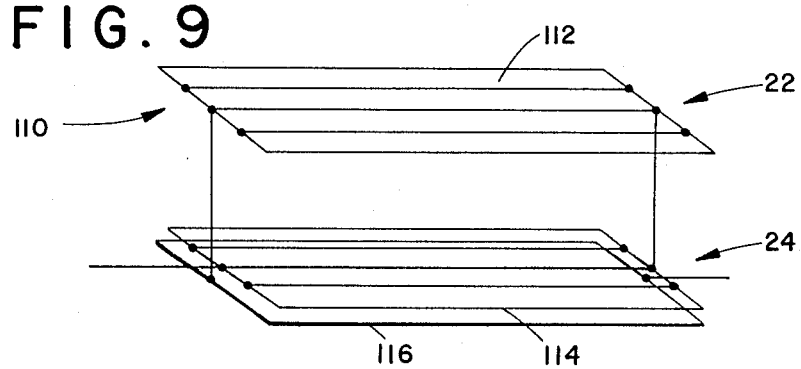
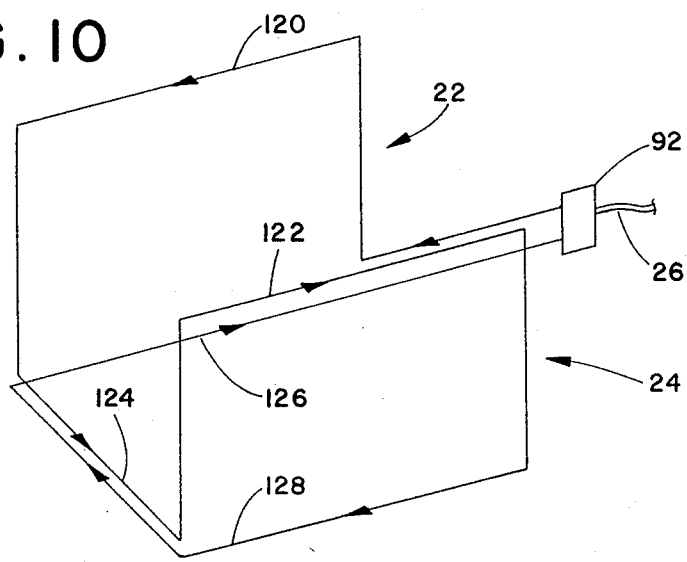

THREE DIMENSIONAL LOCALIZED COIL FOR MAGNETIC RESONANCE IMAGING

The present application is a continuation-in-part of prior pending application Ser. No. 765,708 filed Aug. 14, 1985.

BACKGROUND OF THE INVENTION

The present invention relates to the magnetic resonance arts. It finds particular application in conjunction with surface coils of medical imaging equipment for receiving electromagnetic signals from resonating nuclei and will be described with particular reference thereto. It is to be appreciated, however, that the invention may also find utility in other magnetic resonance applications, such as well logging, chemical analysis, and the like.

Heretofore, various types of coils have been positioned to receive electromagnetic signals for magnetic resonance imaging and spectroscopy, particularly whole body, body portion, and localized coils. The whole body and body portion receiving coils had standard sizes which were selected for readily comparing the patient's whole body or a selected body portion. Due to the standardized coil size and variable patient size, a significant void or empty region was defined between the coil and the portion of the patient to be imaged.

Localized or surface coils were configured from rigid non-conducted sheets of plastic or nylon on which wire or other conductors were mounted. The flat coils were constructed in a variety of sizes and a variety of winding patterns to facilitate positioning the coil adjacent a selected area of the patient and imaging the selected patient area. By placing the localized coil in direct contact with the patient, the intervening air gap along with air gap associated signal-to-noise degradation and aliasing were eliminated or reduced.

A common surface coil configuration was a single loop of wire. To receive signals from deeper within the patient, larger diameter loops were utilized. The depth of the coil's region of sensitivity can also be adjusted with more complex winding patterns, such as a planar arrangement of concentric loops with current flows in different directions.

At high frequencies, the coils interacted strongly with the subject. The coils were most sensitive to the regions of the subject which were in immediate proximity to coil segments. Accordingly, increasing the complexity of the coil winding placed additional coil segments adjacent the subject, each of which was most sensitive to the immediately contiguous region. The more windings in the coil pattern, the more aggravated the problems attributable to the very high sensitivity near the conductors became.

A configuration with two planar concentric loops tended to lower the sensitivity of the coil center close to the coil but gave better uniformity with depth into the subject along the coil axis. However, it increased sensitivity to surface material between the inner and outer loops. This increase interloop sensitivity tended to counterbalance the reduction in surface sensitivity at the center of the coil leading to a negligible, if any, improvement in the signal-to-noise.

In accordance with the present invention, a localized coil is provided which overcomes the above referenced problems and others, yet focuses more specifically on a selected region of interest lying deeper within the subject.

SUMMARY OF THE INVENTION

In accordance with the present invention, a surface coil is provided for receiving electromagnetic resonance signals from within a subject. The coil includes first and second electrical conductor patterns. The first electrical conductor pattern is disposed adjacent the surface of the subject. The second electrical conductor pattern is displaced away from the surface of the subject.

In accordance with a more limited aspect of the present invention, the first and second electrical conductors patterns are mounted on first and second surfaces, respectively. The first and second surfaces are disposed generally parallel or concentrically to each other.

In accordance with another more limited aspect of the present invention, the first and second conductor patterns each include at least one current loop through which current flows in opposite directions to each other. In a yet more limited aspect, the second pattern includes two concentric current loops.

In accordance with yet another more limited aspect of the present invention, the surface coil is utilized in conjunction with a magnetic resonance imaging apparatus. The surface coil is disposed to receive magnetic resonance signals originating within the subject and to convey the received signals to image reconstruction circuitry.

One advantage of the present invention is that it improves image homogeneity. Not only is better homogeneity provided over the region of interest, but the intensity of signals from outside of the region of interest is also reduced.

Another advantage of the present invention is that noise is reduced.

Yet another advantage of the present invention resides in an improved coil quality or Q factor in the loaded condition.

Still further advantages of the present invention will become apparent to those of ordinary skill in the art upon reading and understanding the detailed description of the preferred embodiment.

BRIEF DESCRIPTION OF THE DRAWINGS

The invention may take form in various parts and arrangements of parts or in various steps and arrangements of steps. The drawings are only for purposes of illustrating preferred embodiments and are not to be construed as limiting the invention.

FIG. 8 is yet another alternate embodiment of the surface coil incorporating to compensate for edge effects impedances;

FIG. 9 is a perspective view of an alternate embodiment of the conductive sheet surface coil; and, FIG. 10 illustrates a three dimensional surface coil embodiment.

DETAILED DESCRIPTION OF THE PREFERRED EMBODIMENTS

Figure 1:
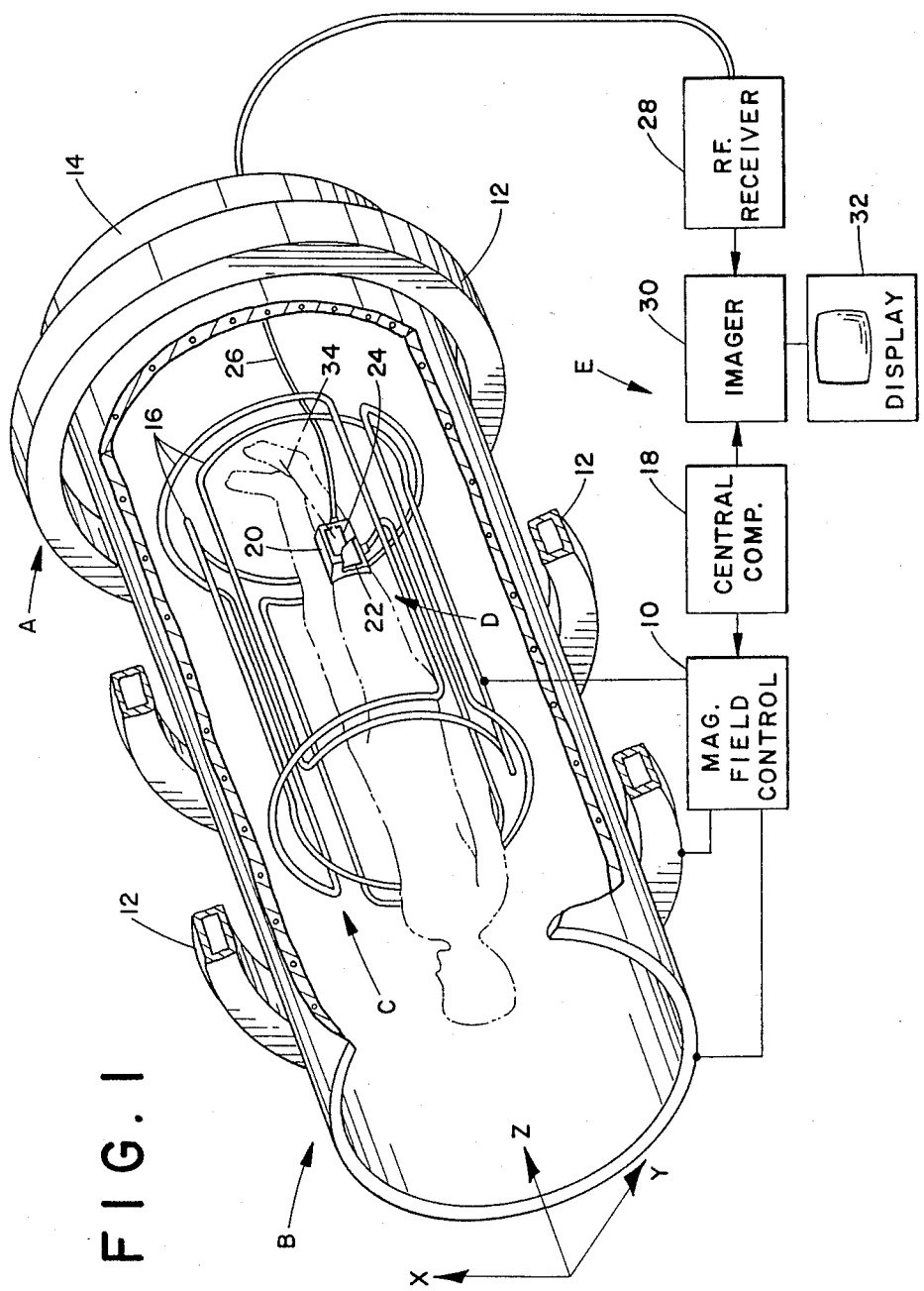
FIG. 1 is a diagrammatic illustration of a magnetic resonance imaging apparatus incorporating the present invention.

With reference to FIG. 1, a magnetic resonance imaging apparatus includes a main magnetic field generating means A for establishing a generally uniform, main magnetic field extending longitudinally through an imaging region along a z-axis. A gradient field means B selectively produces magnetic field gradients transversely across the main magnetic field of the image region. A magnetic resonance excitation means C excites magnetic resonance in selected nuclei of a patient or subject disposed in the image region. The resonating nuclei generate radio frequency magnetic resonance signals which are received by a surface or localized coil D. More specifically, the surface coil is disposed adjacent a preselected region of the subject to be imaged such that it receives magnetic resonance signals from nuclei disposed in the preselected region of interest. Electronic processing circuitry E converts the received radio frequency signals into an image representation indicative of nuclei density, relaxation time, position, nuclei characteristics, or the like.

The main magnetic field means A includes a magnetic field control circuit 10 and a plurality of high power magnets 12. The magnetic field control circuit 10 also functions as a portion of the gradient field control means B to control the angular orientation of the transverse gradient fields generated by a gradient field coil 14. The gradient coil includes a relatively complex winding pattern, such as that shown in U.S. Pat. No. 4,355,282, encased in a protective sleeve. The magnetic field control circuit 10 further causes transmission coils 16 of the resonance excitation means C to broadcast radio frequency signals that excite magnetic resonance with a controlled periphery. A central computer 18 coordinates the generation and timing of the main, gradient, and resonance exciting electromagnetic signals.

The receiving coil D includes a dielectric former or frame 20 on which electrically conductive segments are mounted. More specific to the illustrated embodiment, a first plurality of conducted segments define a first coil portion 22 which is disposed contiguous to an outer surface of the subject. A second plurality of conductive segments define a second coil portion 24 which is displaced from the outer surface of the subject. The first and second coils are mounted parallel to the exterior surface of the subject and to each other.

A flexible cable 26 connects the surface coil with the remotely located processing circuitry E. More specifically, the cable conveys the received radio frequency signals from the surface coil to a radio frequency receiver 28. An imager 30 reconstructs the image representation from the received magnetic resonance signals and the magnetic field control and timing information from the central processer 18. The image representation may be converted to a man-readable display by a video monitor or other display means 32.

With the surface coil portions spaced along an axis 34 perpendicular to the surface of the subject, increased signal-to-noise and better field homogeneity are attained over the region of interest for objects lying deeper within the subject. The surface coil is designed to maximize the sensitivity to a point or region of interest within the subject while minimizing the sensitivity to points outside the region of interest. Because high frequency coils tend to be dominated by subject generated noise, it is at least as important to reduce the coil sensitivity to areas outside of the region of interest as it is to increase its overall sensitivity. In the present invention, the magnetic field in the proximity of the conductors nearest the subject is reduced substantially. The sensitivity at a point deeper within the subject is also reduced, but by a much smaller amount than the surface or close to the conductor region. In this manner, the ratio of the sensitivity at a point of interest within the subject to the sensitivity over the total magnetic field is increased.

Figure 2:
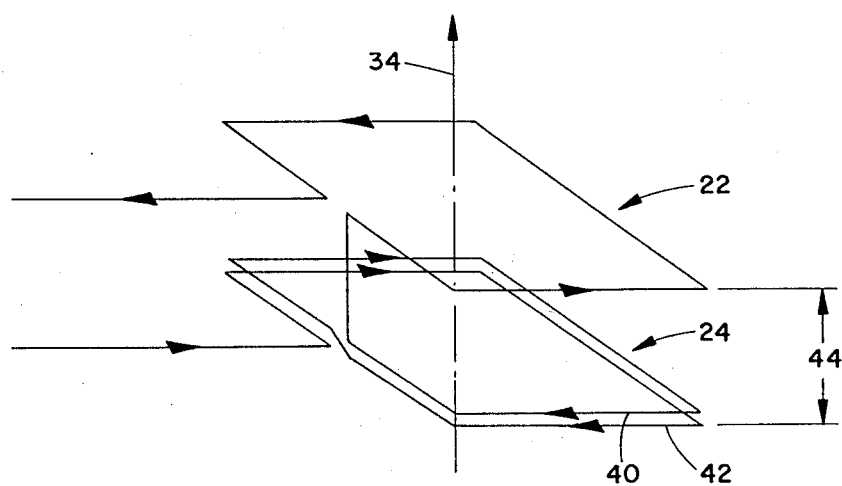
FIG. 2 is a perspective view illustrating a localized coil construction in accordance with the present invention.

With reference to FIG. 2, a preferred embodiment of the surface coil includes three conductive loops. More specifically, the first coil portion 22 is a single loop disposed adjacent the surface of the subject and electrically connected such that the current phase is in a first direction, e.g. counter clockwise. The second coil portion 24 includes a first conductor loop 40 and a second conductor loop 42 which are interconnected to have a second current phase which is opposite to the first current phase, e.g. clockwise. That is, the sensitive patterns subtract the first and second coil portions separated by a distance 44. In this manner, a positive current sense loop and a pair of counter current phase loops are provided. These latter two form a dipole pair. The dipole pair has a field which falls-off more quickly than the single loop with which its field subtracts along the axis perpendicular to its face. With longer distances into the subject, the field remains more nearly constant. The characteristic fall-off is governed by the separation distance 44.

Figure 3:
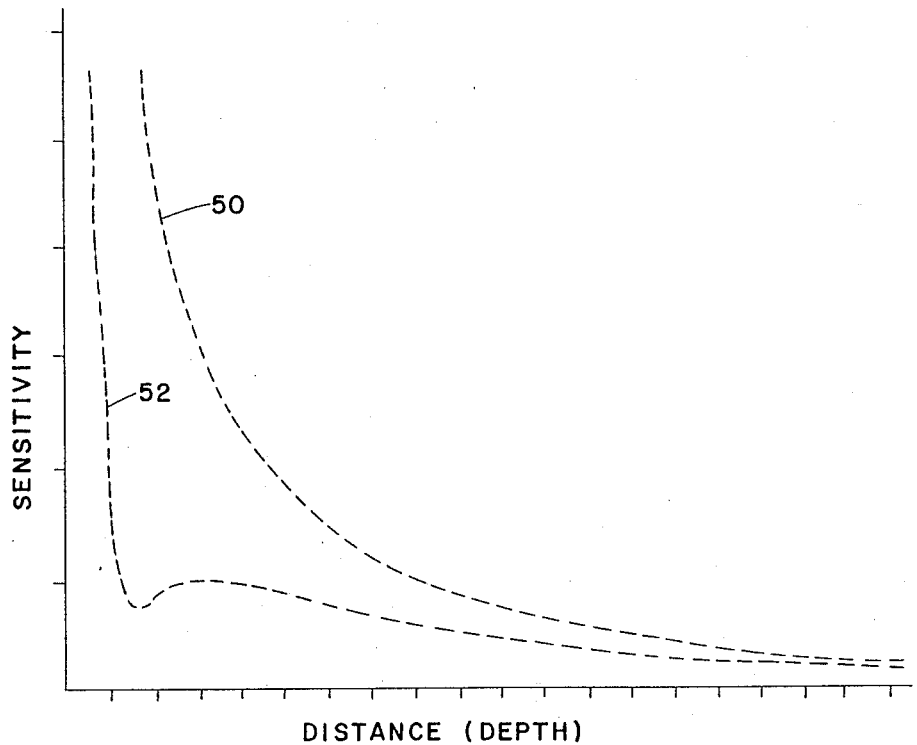
FIG. 3 illustrates the fall-off in the magnetic field along an axis perpendicular to the face of the coil for single surface loops and for three dimensional localized coils of the type illustrated in FIG. 2.

With reference to FIG. 3, a single surface coil loop has a sensitivity versus depth within the subject curve which falls-off generally exponentially as illustrated at curve 50. That is, a single coil has a very high sensitivity adjacent the surface of the subject and a relatively small sensitivity in the subject interior. The three loop configuration of FIG. 2 provides a sensitivity pattern as illustrated by curve 52. That is, the coil sensitively drops off much more rapidly adjacent the subject surface and has a more uniform sensitivity with depth into the subject. The dipole coil curve 52 is taken for coil configuration in which the coil separation distance 44 is about 0.15 times the radius of the loops. Although coil separation distances 0.25 times a median radius of the loop are particularly advantageous, other separation distances are also contemplated.

Figure 4:
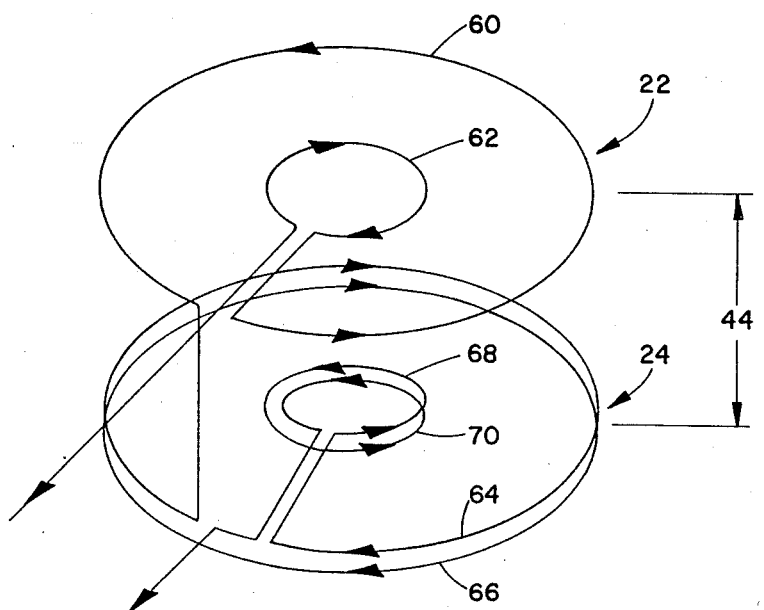
FIG. 4 is an alternate embodiment of the localized coil.

Although the loops of FIG. 2 are illustrated as being connected in series, other combinations may also be selected. For example, the loops may also be connected in parallel. With reference to FIG. 4, the first coil portion 22 may include an outer loop 60 connected with a first current phase and an inner loop 62 with a second, opposite current phase. The second current portion 24 includes a pair of outer current loops 64, 66 connected with the second current phase and a pair of inner loops 68, 70 with the first current phase. Although illustrated as circular loops, it is to be appreciated that the conductors may also be elliptical, rectangular, a generally amorphous closed loop, or the like. It is further to be appreciated that other combinations of loops are also contemplated, e.g. one opposed with three in phase, two opposed with 3, 4, 5, or more in phase, and the like.

The displacement 44 between the first and second coil portions may be maintained with various structures. As one example, the current loops may be fabricated of a rigid metal tube or rod which has sufficient structural strength to maintain the illustrated pattern. As another example, the conductive loops may be mounted to opposite surfaces of a flexible dielectric having the thickness 44.

Figure 5:
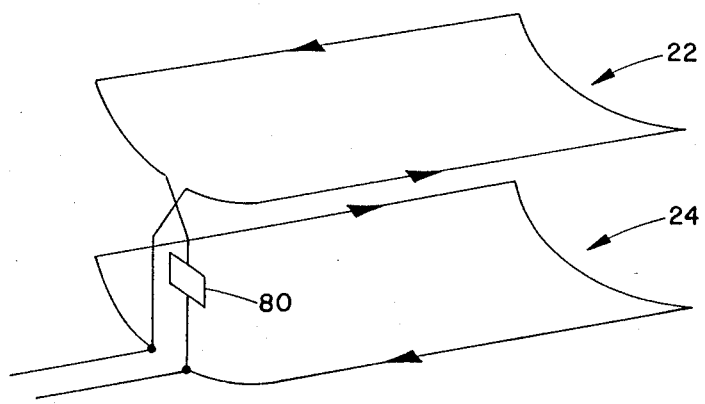
FIG. 5 is another alternate embodiment of the localized or surface coil.

With reference to FIG. 5, in another alternate embodiment, the first coil portion 22 and the second coil portion 24 each include a single loop which are interconnected to have the opposite phase. An impedance control circuit 80, such as a reactance, sets the relative impedance of the first and second coil portions to control the relative amount of current flowing in each loop. For example, the impedance may be set such that the loop closest to the subject outer surface has reduced current flowing therethrough relative to the second or outer current loop.

In the embodiment of FIG. 5, the first coil portion 22 and the second coil portion 24 are disposed along first and second parallel surfaces. The first and second surfaces are each defined along concentric cylinders such that the first and second surfaces are arcuate but parallel. Other surface configurations may analogously be selected and defined by a rigid, coil supporting dielectric former to match the coil configuration to the subject outer surface.

Figure 6:
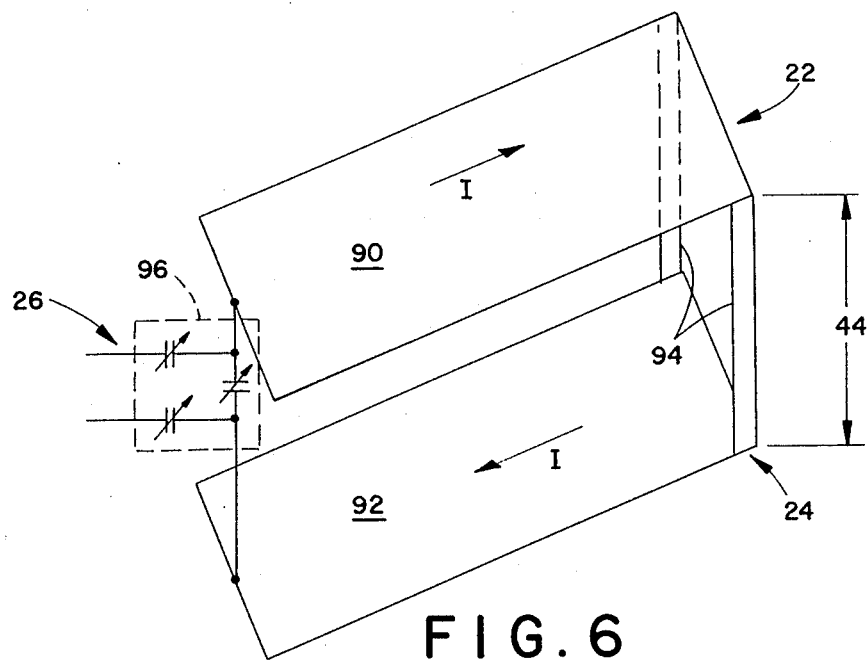
FIG. 6 is yet another alternate embodiment of the localized or surface coil incorporating conductive sheets.

With reference to FIG. 6, the first and second coil portions 22 and 24 may be continuous, broad, conductive surfaces 90 and 92 respectively. An electrical conductor 94 interconnects with one end of the first and second coil portions and a matching circuit 96 interconnects the other ends with the cable 26. The separation distance 44 again affects the depth of the field sensitivity. A small dimension 44 makes the coil more sensitive to objects close to the coil and a large dimension 44 improves the relative sensitivity to deeper lying objects.

Figure 7:
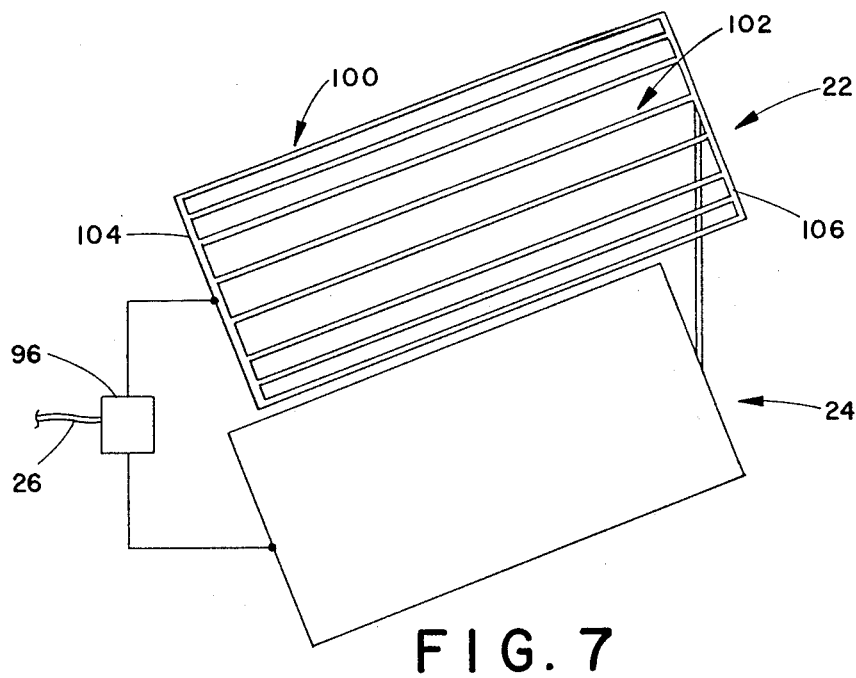
FIG. 7 is yet another alternate embodiment of the surface coil in which the conductors are arranged at non-uniform displacement parallel to the surface of the subject.

It is to be appreciated that an infinite current sheet produces a perfectly uniform magnetic field. When the current sheet has only a limited expanse, edge corrections may be made to account for its non-infinite extent. A suitable edge correction may be achieved by increasing the current density adjacent the edge relative to the center. With reference to FIG. 7, appropriate edge compensation can be attained by replacing the continuous sheet 90 or 92 with a plurality of conductors extending in the current direction. To provide edge compensation, edge conductors 100 are spaced closer together and central conductors 102 are spaced further apart. The non-uniformly spaced conductors are interconnected at their ends by conductors 104 and 106. The non-uniformly spaced conductors may be utilized as the first coil portion 22. The second coil portion 24 might still be a continuous sheet or may be an analogous conductor arrangement.

With reference to FIG. 8, edge compensation can also be achieved by adjusting the current flow in each conductor by interconnecting the individual conductors with impedances 108. By appropriately selecting the impedances, the conductors may be disposed with regular spacing or may be disposed with uneven spacing. The parallel conductive segments with interconnecting impedances may be utilized as the inner or first coil portion or the second coil portion.

With reference to FIG. 9, the upper coil portion 22 may include a conductive sheet 110 defined by a plurality of parallel disposed conductors 112. The second coil portion 24 may include a pair of conductive sheets 114, 116 defined by a plurality of parallel disposed conductive rods or a continuous sheet. This further increases the sensitivity to deep objects as compared to objects close to the coil face.

With reference to FIG. 10, commonly only transverse magnetic field components, i.e. in the x, y, plane produce desired signals from the subject. Longitudinal components along the z-axis are attributable to noise. Longitudinal extending conductors 120, 122 which receive the x,y field components are disposed adjacent the subject. The transverse coil portions 124 which receive noise are positioned more remote from the subject. Optionally, the second coil portion 24 may include longitudinally extending conductors 126, 128 to define a current path of the opposite phase the more remote distance from the patient.

The invention has been described with reference to the preferred embodiments. Obviously, modifications and alterations will occur to others upon reading and understanding the preceeding specification. For example, although two current planes or loops achieve a large degree of field shaping, three or more current planes or loops may provide additional degrees of freedom. It is intended that the invention be construed as including all such alterations and modifications insofar as they come within the appended claims or the equivalents thereof.

Having thus described the preferred embodiments, the invention is now claimed to be:

1. A magnetic resonance imaging apparatus comprising:
   a main magnetic field generating means for generating a main magnetic field longitudinally along an image region;
   a gradient field means for producing magnetic field gradients across the main magnetic field in the image region;
   a magnetic resonance excitation means for exciting magnetic resonance in nuclei of a subject in the image region;
   a receiving coil assembly for receiving radio frequency signals from the resonating nuclei, the coil assembly including at least a first conductive loop disposed adjacent an exterior surface of the subject and at least a second conductive loop disposed generally parallel to the first loop and displaced outward from the subject exterior surface, the first and second conductive loops being interconnected with opposite current phase; and,
   an image reconstruction means for reconstructing an image representation from the received resonance signals.

2. The apparatus as set forth in claim 1 wherein the second coil portion further includes a third current loop interconnected with the first and second current loops with the same current phase as the second current loop.

3. A magnetic resonance imaging apparatus comprising:
   a main magnetic field generating means for generating a main magnetic field longitudinally along an image region;

a gradient field means for producing magnetic field gradients across the main magnetic field in the image region;

a magnetic resonance excitation means for exciting magnetic resonance in nuclei of a subject in the image region;

a receiving coil assembly for receiving radio frequency signals from the resonating nuclei, the coil assembly including at least one conductor extending longitudinally adjacent an exterior surface of the subject and at least a second conductor extending longitudinally in a plane generally parallel to and displaced outward from the subject exterior surface, the first and second conductors being electrically interconnected with an opposite current phase; and, an image reconstruction means for reconstructing an image representation from the received resonance signals.

4. The apparatus as set forth in claim 3 wherein the first and second conductors include generally planar conductive sheets.

5. The apparatus as set forth in claim 3 further including a plurality of the first conductors.

6. The apparatus as set forth in claim 5 wherein the second conductor includes at least one generally planar sheet.

7. A localized coil assembly for receiving magnetic resonance signals from resonating dipoles disposed within a subject, the localized coil assembly comprising:
a first coil portion disposed adjacent an exterior surface of the subject; and,
a second coil portion disposed adjacent the first coil portion and displaced from the subject outer surface, the second coil portion being electrically connected with the first coil portion with an opposite current phase.

8. The apparatus as set forth in claim 7 wherein the first and second coil portions are mounted on opposite faces of a flexible dielectric spacer.

9. The coil assembly as set forth in claim 7 wherein the first coil portion includes a first current loop and the second coil portion includes a second coil loop, the first and second coil loops being disposed generally parallel to each other and to the subject exterior surface.

10. The coil assembly as set forth in claim 9 wherein the second coil portion further includes a third current loop, the first, second, and third current loops being interconnected such that the first current loop has a first current phase and the second and third current loops have a second, opposite current phase.

11. The coil assembly as set forth in claim 10 wherein the first coil portion further includes a fourth current loop concentric with and smaller than the first current loop and wherein the second coil portion further includes fifth and sixth current loops disposed concentric with and smaller than the second and third current loops, the fourth, fifth, and sixth current loops being interconnected with the first, second, and third current loops such that the fourth current loop has the second current phase and the fifth and sixth current loops have the first current phase.

12. The coil assembly as set forth in claim 7 wherein the first coil portion includes a generally planar conductive surface and the second coil portion includes a second generally planar surface.

13. The coil assembly as set forth in claim 12 wherein the second coil portion further includes a third generally planar conductive surface disposed parallel and closely adjacent to the second generally planar conductive surface and having the same current phase as the second generally planar conductive surface.

14. The coil assembly as set forth in claim 13 wherein at least one of the first and second conductive surfaces are defined by a plurality of parallel disposed conductors.

15. A localized coil assembly for receiving magnetic resonance signals from resonating dipoles disposed within a subject, the localized coil assembly comprising:
a first coil portion disposed adjacent an exterior surface of the subject;
a second coil portion disposed adjacent the first coil portion and displaced from the subject outer surface; and,
wherein at least one of the first and second coil portions includes a plurality of generally parallel disposed conductors.

16. The coil assembly as set forth in claim 15 wherein the plurality of conductors are non-uniformly spaced.

17. The coil assembly as set forth in claim 15 further including a plurality of impedances interconnecting the plurality of conductors such that different amounts of current flow therethrough.

18. The coil assembly as set forth in claim 7 wherein the first coil portion includes at least one conductive segment and wherein the second coil portion includes at least two conductive segments, the second coil portion conductive segments being disposed parallel to the first coil portion conductive segment.

19. A localized coil assembly for receiving magnetic resonance signals from resonating dipoles disposed within a subject, the localized coil assembly comprising:
a first pair of conductive segments disposed adjacent an exterior surface of the subject;
electrical conductors for interconnecting the first pair of conductive segments, the electrical conductors being displaced from the subject exterior surface; and,
a second coil portion disposed adjacent the first pair of conductive segments and displaced from the subject outer surface.

20. A localized coil assembly for receiving magnetic resonance signals from resonating dipoles disposed within a subject, the localized coil assembly comprising:
at least two longitudinally extending first conductive segments which are interconnected such that current flows therethrough with opposite phase, the first conductive segments being disposed adjacent an exterior surface of the subject; and,
at least two longitudinally extending second conductive segments which are interconnected with each other such that current flows therethrough with opposite phase and which are interconnected with the first conductive segements such that current flows through the first and second conductive segments with opposite phase.

21. A magnetic resonance imaging apparatus comprising:
a main magnetic field generating means for generating a main magnetic field longitudinally along an image region;
a gradient field means for producing magnetic field gradients across the main magnetic field in the image region;

a magnetic resonance excitation means for exciting magnetic resonance in nuclei of a subject in the image region;

a single receiving coil tuned for receiving magnetic resonance signals of a preselected radio frequency spectrum, the receiving coil including a first coil portion disposed adjacent an exterior surface of the subject to receive the preselected frequency magnetic resonance signals and a second coil portion disposed generally parallel to the first coil portion and displaced outward from the subject exterior surface to receive the preselected frequency magnetic resonance signals, the first and second coil portions being electrically connected; and, an image reconstruction means for reconstructing an image representation from the received resonance signals.

22. A localized coil assembly for receiving magnetic resonance signals from resonating dipoles disposed within a subject, the localized coil assembly comprising:

a first coil portion disposed adjacent an exterior surface of the subject;

a second coil portion disposed adjacent the first coil portion and displaced from the subject outer surface, the second coil portion being electrically connected with the first coil portion; and, an impedance means for tuning the first and second coil portions to a common resonance frequency, whereby the first and second coil portions cooperatively receive resonance signals from like resonating dipoles.

* * * * *